United States Patent [19]

Bilowith et al.

[11] Patent Number: 4,912,547

[45] Date of Patent: Mar. 27, 1990

[54] TAPE BONDED SEMICONDUCTOR DEVICE

[75] Inventors: James A. Bilowith, Colchester; Edward J. Dombroski, Jericho; William H. Guthrie, Essex Junction; Richard W. Noth, Fairfax, all of Vt.

[73] Assignee: International Business Machines Corporation, Armonk, N.Y.

[21] Appl. No.: 303,207

[22] Filed: Jan. 30, 1989

[51] Int. Cl.⁴ .................... H01L 23/12; H01L 23/48; H01L 23/02
[52] U.S. Cl. ........................................ 357/80; 357/70; 357/71
[58] Field of Search ............................. 357/70, 74, 80

[56] References Cited

U.S. PATENT DOCUMENTS

| | | | |
|---|---|---|---|
| 3,628,105 | 12/1971 | Sukai et al. | 317/234 R |
| 4,538,210 | 8/1985 | Schaller | 361/401 |
| 4,638,348 | 1/1987 | Brown et al. | 357/80 |
| 4,801,765 | 1/1989 | Moyer et al. | 29/827 |
| 4,801,999 | 1/1989 | Hayward et al. | 357/80 |
| 4,827,377 | 3/1989 | Butt | 361/401 |

FOREIGN PATENT DOCUMENTS

| | | | |
|---|---|---|---|
| 0180154 | 9/1985 | Japan | 357/71 |
| 0150253 | 7/1986 | Japan | |
| 0009652 | 1/1987 | Japan | 357/74 |
| 0066959 | 3/1988 | Japan | 357/70 |
| 0124434 | 5/1988 | Japan | 437/214 |

Primary Examiner—Andrew J. James
Assistant Examiner—Viet Q. Nguyen
Attorney, Agent, or Firm—Francis J. Thornton

[57] ABSTRACT

Multiple, single conductor, tape automated bonding (TAB) tapes are sequentially applied to a semiconductor device by the bonding of a first, etched, single layer TAB tape to an outer row of bonding pads on a semiconductor chip and to selected contacts on a lead frame followed by the laying down of at least one additional etched, single layer TAB tape which is then bonded to an inner row of bonding pads on the semiconductor chip and to different selected lead frame contacts. If desired the subsequent TAB tape may be adhered to the preceding TAB tape to increase the mechanical strength of all the tapes and improve the electrical characteristics of the tapes. The application of one or more ground planes to the assembly is also shown.

12 Claims, 4 Drawing Sheets

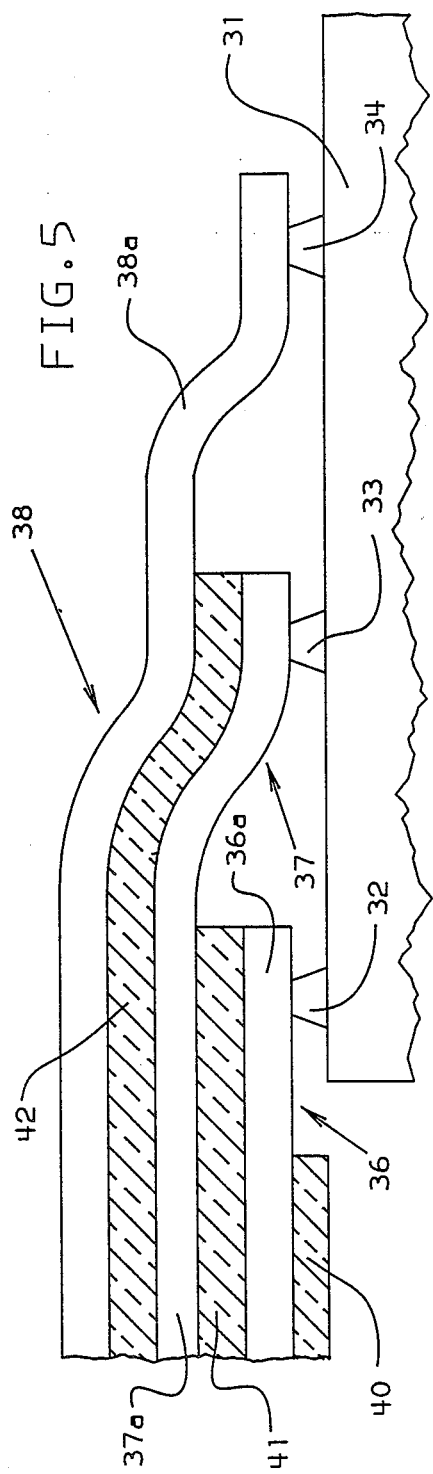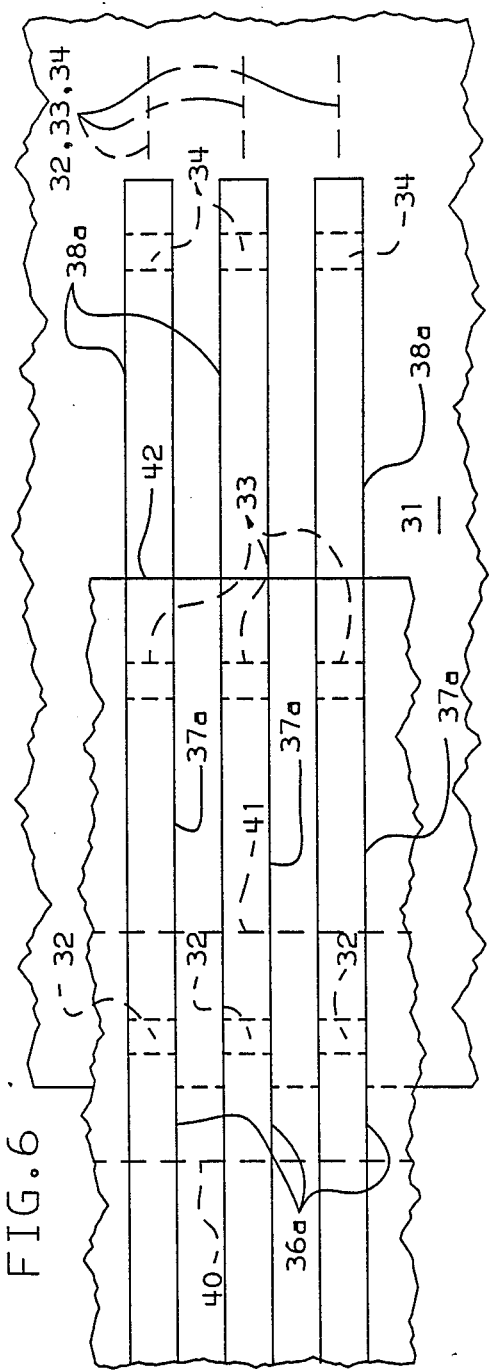

TAPE BONDED SEMICONDUCTOR DEVICE

BACKGROUND OF THE INVENTION

1. Field Of The Invention

This invention relates generally to carrier tapes for semiconductor devices and more particularly relates to an improved tape bonded semiconductor device structure using semiconductor chips having denser bonding pads than envisioned by the prior art and to a method of connecting carrier tapes with dense input/output leads to the improved semiconductor chip.

2. Prior Art

The semiconductor industry is driven by automation and smaller packages and is presently producing devices with the so-called TAB, i.e. Tape Automated Bonding, technique in which the tape, is comprised of an insulating carrier, formed of a material such as polyimide or the like, carrying a multiplicity of thin metallic films which extend beyond openings in the polyimide to form what are generally called tape leads or fingers. The metallic film, usually a copper based material, is generally very thin, typically 0.5 to 3 mils in thickness. Generally, to form the tape the metallic film is laid down on the polyimide substrate and the fingers, i.e. the leads, formed insitu by etching or other suitable forming techniques. Following this, a portion of the carrier is removed, by etching or the like, under the inner and outer tips of the fingers. The finished tape is used by precisely aligning each inner tip with a respective bonding pad on a semiconductor chip and bonding the chip to the pad by thermo compression. In TAB automated bonding this thermo compression bonding is performed by a single bonding tool in a method called gang bonding. Similarly, the outer tip of each finger is bonded for example, to a respective lead on a so-called lead frame. Such lead frames are formed of metal substantially heavier and stiffer and are designed to be self supporting and to extend through the exterior of the package.

In the past, most of TAB tapes were formed with a single metallic foil on one side of the insulating carrier film. As chips became more complex, and used double rows of bonding pads, industry responded by placing a second metallic film on the opposite side of the insulating carrier so that connections could be made to the two rows of bonding pads on the chip. This necessitated complex alignment techniques to assure that after etching of both metallic film the metallic fingers formed on each side of the carrier were properly aligned with respect to one another and were of the proper length. This in turn necessitated the use of complex techniques to remove the selected portions of the insulating carrier itself from between the metallic films. This caused the tape, for such designs, to be very expensive and quite difficult to make. Moreover because of the thickness of the fingers and the manner of formation of the double-sided TAB tape it was necessary to offset the pads in the second or inner row of bonding pads on the chip so that they were aligned with the space between the pads of the outer row, i.e. staggered. Still further, the construction did not permit the use of more than two rows of bonding pads on the chip.

SUMMARY OF THE INVENTION

The present invention, in which multiple single layers of metallic tape are utilized, avoids the difficulties encountered with the double-sided tape of the prior art. The use of the present invention eliminates the requirement for double-sided etching alignment of the tape thus eliminating the etching or removal of the polyimide between two metallic layers; eliminates the need for staggering the pads on the chip; permits the use of and access to more than two rows of pads on the chip; and allows a 90% increase in density in the bonding pads on the chip resulting in a significant reduction in chip size.

The invention thus not only reduces the cost and eliminates the requirement of the double-sided photoetch but also makes possible shorter unsupported finger lengths. The present invention further permits unique arrangements for providing more complete voltage or ground shielding to reduce capacitance noise than was hitherto possible.

The present invention requires the bonding of a first, etched, single layer TAB assembly to an outer row of bonding pads on a semiconductor chip and to selected contacts on a lead frame and the laying down of at least one additional etched, single layer TAB assembly which is then bonded to an inner row of bonding pads on the semiconductor chip and to different selected lead frame contacts. If desired the subsequent TAB assembly may be adhered to the preceding TAB assembly to increase the mechanical strength of all the assemblies and improve the electrical characteristics of the assemblies. The application of one or more ground planes to the assembly is also shown.

By using the present invention the necessity of staggered bonding pads on the chip may be eliminated, the distance between bonding pads can be minimized, and significant cost reduction realized.

BRIEF DESCRIPTION OF THE DRAWINGS

FIG. 5, shows the present invention used with a semiconductor chip having three rows of interconnection pads.

FIG. 6, shows a partial top view of FIG. 5.

DETAILED DESCRIPTION OF THE PRIOR ART

Figure 1:
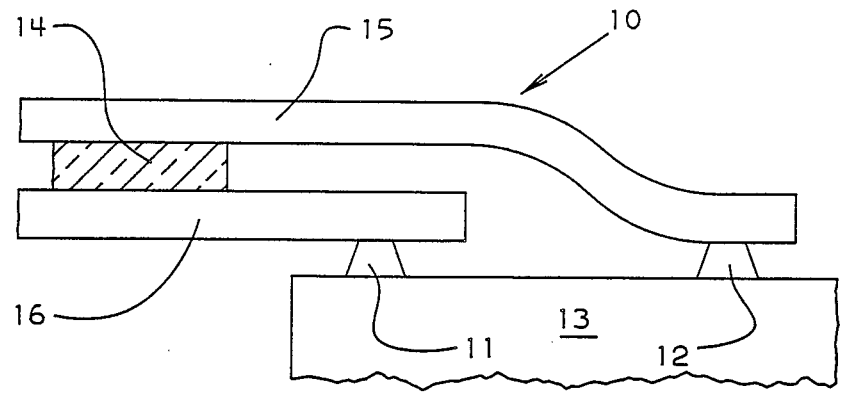
FIG. 1, shows the side view of a prior art double layered, double-sided polyimide TAB construction mounted on a semiconductor device.
Figure 2:
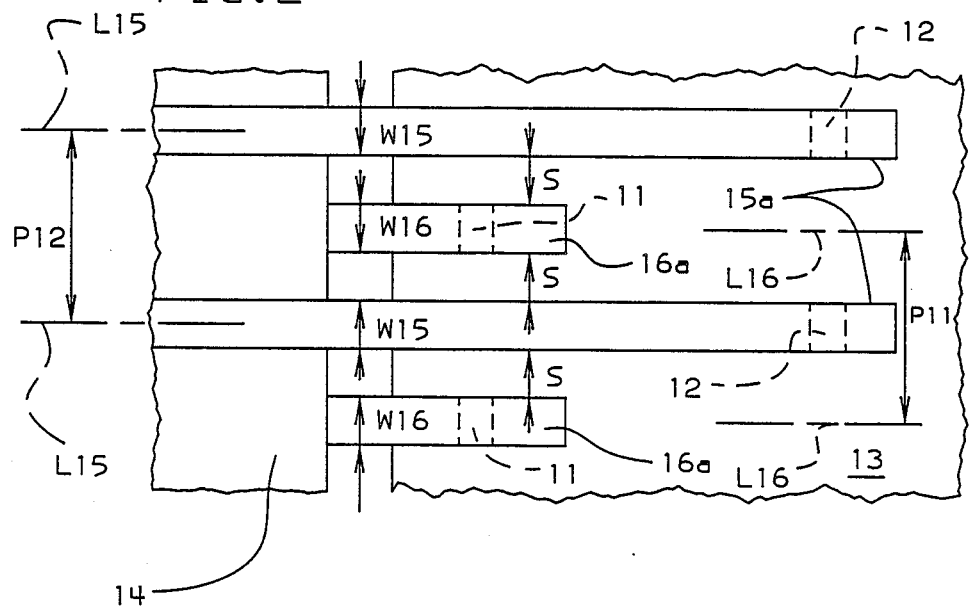
FIG. 2, shows a partial top view of the prior art double-sided tape of FIG. 1.

FIG. 1, shows a prior art double-sided TAB assembly 10 bonded to the bonding pads 11 and 12 of a semiconductor chip 13. The assembly 10 is formed of an insulating substrate 14 carrying a set 15 of metallic top fingers and a set 16 of metallic bottom fingers. The substrate 14 has suitable stability and insulation qualities to prevent shorting between the top set of metal fingers and the bottom set of metal fingers. Generally, these sets, 15 and 16, are formed by depositing metal layers on an underlying substrate, such as a polyimide film. These metal layers may be, for example, formed by the adhesion of foils to the substrate of by the electro-deposition of metal on the substrate. In addition these metal layers can be plated with other metals for use in further processing. Once the foils are deposited on the substrate the individual fingers 15a and 16a, as shown in FIG. 2, are formed by any suitable forming technique, i.e. photoetching, known to the art. Typically these fingers are two mils (0.002 inches) in width and have an edge to edge spacing of 1.5 mils (0.0015 inches). Once the sets of fingers are formed, that portion of the substrate lying between the ends, 15a and 16a, of the fingers of each set 15 and 16 is removed by a suitable process such as etching.

The most common method of bonding the individual fingers tips 15a, 16a to respective semiconductor pads on the chip is to gold plate the tips of the fingers and the chip pads. The plated finger tips, of each set of fingers are aligned to the chip pads in a respective row of pads and a thermal compression bond is made by a gang bonding tool simultaneously applying heat and pressure to all the finger tips and the underlying bonding pads (typically 500°-550° C. and 30K to 50K PSI). As shown in FIG. 1 and FIG. 2 the tips 16a of finger set 16 are bonded to pads 11 and the tips 15a of finger set 15 are bonded to pads 12. Because it is necessary to remove a portion of the insulation 14 between the finger sets 15 and 16 and because the tips of the individual fingers of each set must be forced against the underlying chip pads the individual fingers of each set must lie on a distinct and different longitudinal axis from any other finger. Thus each finger of set 15 must lie on a longitudinal axis L15 and each finger of set 16 lies on an individual longitudinal axis L16. Thus the axis of any single finger in a set is separated from any adjacent finger in the same set by twice the separation S between fingers of different sets plus the width W of both sets of fingers.

When constructing a device with a high bonding pad count and using the copper/polyimide TAB assembly structure described above, the tape is made in reel form with a frame of personalized circuitry allocated for each device. Typical tape widths are 35mm and up, and segments are spliced together to form a reel of tape. The result is a semiconductor chip which has leads attached to it which have their other ends (not shown) free and available for attachment to a second level carrier (not shown) (usually a lead frame, a printed circuit card or a carrier substrate or the like). Joining of the free outer ends (not shown) of the TAB assembly to the second level carrier is usually made with a low temperature solder.

For high density pads on a semiconductor chip it is advantageous to have very small fingers on close spacing so that the semiconductor chip size can be held to a minimum thus keeping the cost low. For example, if a chip requires 440 I/O pads and the I/O pads are in double, peripheral, i.e. staggered, rows around the outside of a square die, as typically used with the prior art double-sided tapes, the die size is established by the bonding pad pitch, i.e. the distance between the midpoint of adjacent bonding pads in a row of pads on a chip. For a pitch of 6 mils the chip size would be approximately 9.3mm square and for a 4 mil pitch the chip size would be 6.2mm square. The chip bonding pads are typically 2 to 3 mils in diameter, and are somewhat flattened as a result of the thermal compression bonding. This pad pitch is further influenced by the width (W) of the individual fingers 15 and 16 and the separation (S) of the fingers of one set (say fingers 15) with respect to the fingers of the other set (say fingers 16).

Thus to maximize the advantage of the double-sided tape of the prior art and to obtain smaller die size and-/or higher density the prior art used a double stagger row, as shown in FIG. 2 where the pitch of the pads in both rows 11 and 12 is respectfully designated by the symbols P11 and P12. It should be noted that, in a chip using a double stagger pad arrangement, the pitch of each row, i.e. P11 or P12, cannot be equal to less than the width (W) of both sets of fingers plus twice the separation S, i.e.:

$$P11 = W_{16} + 2S + W15 \text{ and } P12 = W_{15} + 2S + W16.$$

While the two-sided metal tape allows some advantages in density and performance and helps reduce the size of the semiconductor chip it greatly increases the cost of the tape and because as the number of I/O pads increase on the chip the force for the simultaneously bonding of all the fingers to all the chip pads increases linearly, increased die damage may result especially as the I/O pads increase to the limits available with this configuration.

DESCRIPTION OF THE INVENTION

The present invention comprises the use of a plurality of single layer tapes individually and sequentially mounted on a semiconductor chip.

Figure 3:
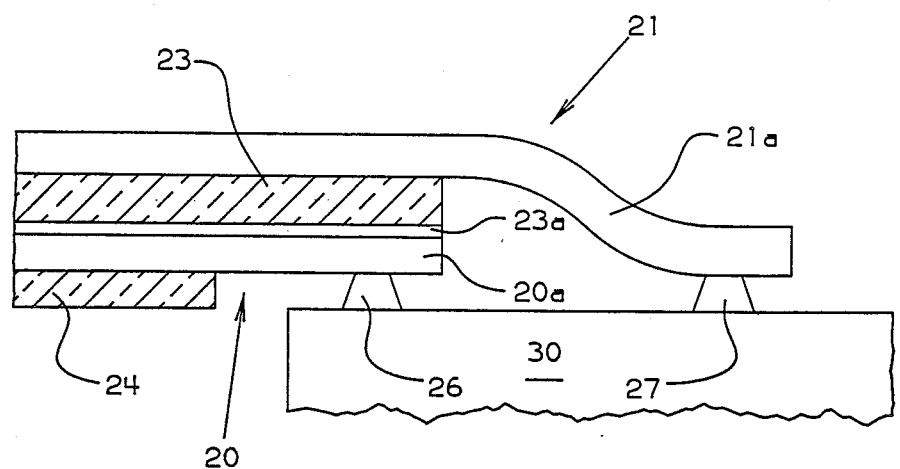
FIG. 3, shows a side view of the present invention as mounted on a semiconductor chip.
Figure 4:
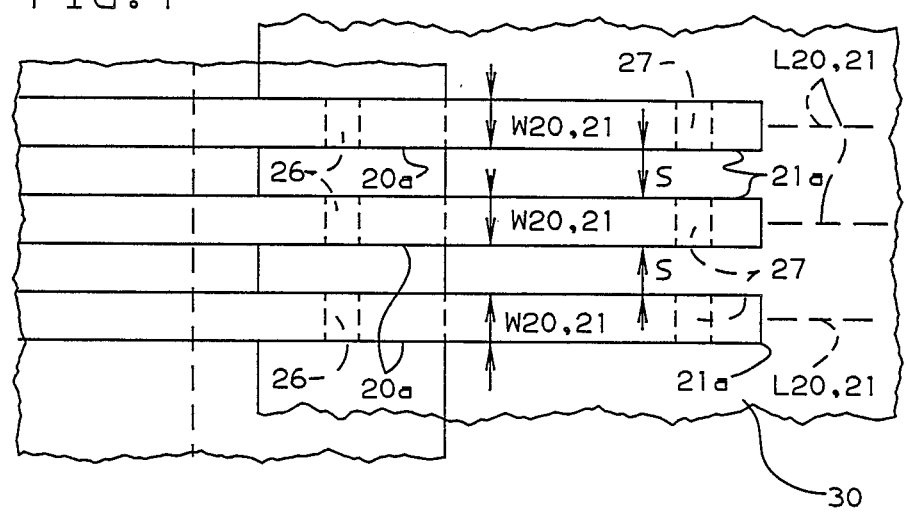
FIG. 4, illustrates a partial top view of FIG. 3.

FIGS. 3 and 4 show the present invention which avoids the above described problems while reducing the cost and increasing pad density to almost twice that of the staggered row configuration used with the prior art. The present invention as shown in these FIGS. 3 and 4 comprises the use of two single layered tapes 20 and 21 individually mounted on a chip 30. Tape 20 comprises a set of individual, conductive fingers 20a and an insulating layer 24 and tape 21 comprises a set of individual conductive fingers 21a and a separate and distinct insulating layer 23. As is well known to the art, such tapes generally are, for example, formed by depositing a metal layer on the surface of the insulating layer and then etching the metal layer to form the fingers atop the insulating layer. The present invention is used by preparing a first single layer tape 20 so that the tips of fingers 20a will mate with respective input/output (I/O) pads 26 arranged as an outer row on chip 30. This lower tape 20 is then aligned and bonded to these pads 26 of this outer row by a first bonding step. Next a second tape 21 is formed so that the tips of the fingers 21a will mate with respective I/O pads 27 arranged as a second, inner row on chip 30. The tips of fingers 21a are aligned and bonded to these pads 27 of this inner row of I/O pads by a second bonding step. Either upon bonding or immediately thereafter, the second set of fingers 21 has its underlying polyimide layer 23 affixed, such as by a suitable epoxy adhesive 23a, to the underlying first set of fingers on tape 20. When the layers 23 and 24 are formed of a polyimide, such as sold under the tradename Kapton, a suitable adhesive may be a thermo setting phenolic butyral adhesive such as sold under the tradename Rogers 8970. Alternately, this layer 23a can be a polymeric 23, up to about 5 mils in thickness, which, when heated by a thermo compression bonder, will flow around the fingers 20a and bond to the fingers 20a and the underlying insulating layer 24. If desired a polymeric sealant may be dispersed over the upper leads 21. Such sealants include silicones, epoxies, acrylics, polyimides and silicone-polyimides.

By using a polymeric as layer 23a and causing to flow around the fingers 20a and bond to the insulating layer 24 bias-induced copper electromigration between the leads 20a is reduced, mechanical strength is improved, and tape curl is reduced.

By using two separate sets of fingers and applying them individually the density of the underlying pads 26 and 27 can be increased. For, as shown in FIG. 4, the leads of each set lie on the same longitudinal axis L20,21, thus the pitch between any two lines of the same set is no longer 2S+2W as shown in FIG. 2, but is equal to S+W. This occurs because the fingers of both sets now lie over one another and are not separated by the fingers of the other set.

By using the dual tape approach of the present invention the density of the underlying pads 26 and 27 is made approximately double that possible with the prior art tape. For, as shown in FIG. 4, the pitch between fingers of each set is identical since the longitudinal axis of each line lies in the same position.

In the present invention this significant reduction in pitch is possible because first, the lower tape is independently bound to the outer row of pads and then the upper tape is independently bonded to the inner row of pads. Thus, respective fingers of each tape can overlie the same longitudinal axis.

Thus, the present invention, even with the same width of fingers as that of the prior art, can have a pitch with one-half that required by the prior art double-sided tape.

The present invention can be further extended by adding a third tape that would bond to a third row of the pads interior to the previous two rows thus further increasing the available number of pads on a chip without affecting the size of the chip to any dramatic degree. It was not known in the prior art as to how such a third row of pads could be contacted.

Such a three layer configuration is shown in FIG. 5 and FIG. 6. FIG. 5 is a sectional view of a three layer embodiment of the invention bonded to a semiconductor body 31 via a series of pad rows 32, 33 and 34 and FIG. 6 shows a top view of this three layer embodiment.

In FIG. 5 there is used three distinct single sided tapes 36, 37, and 38 each of which comprises a set of individual fingers formed on an insulating layer. Thus tape 36 has a set of individual fingers 36a and an insulating layer 40, tape 37 has a set of individual fingers 37a and an insulating layer 41 and tape 38 has a set of individual fingers 38a and an insulating layer 42. Each of these fingers all over lie the same longitudinal axis L32,33,34.

This three layer configuration is formed by first bonding the tips of fingers 36a to pads 32 then placing tape 37 over tape 36 and bonding the tips of fingers 37a to pads 33 and securing insulating layer 41 to tape 36 and finally placing tape 38 over tape 37 and bonding the tips of fingers 38a to pads 34 and securing tape 38 to tape 37. It should be noted that this multiple tape configuration is denser than that of FIGS. 3 and 4 for each of the tapes have their fingers lying on the same longitudinal axis L32,33,34.

It should be understood that each of the tapes 37 and 38 could both be provided with either adhesive or polymeric layers (not shown) similar to that discussed above in conjunction with FIG. 3, so that the underlying fingers 36a and 37a can be effectively encapsulated. Similarly the fingers 38a can also be coated with a sealant in the manner discussed in FIG. 3.

If desired, the middle tape 37 could have its fingers connected to signal pads while the fingers of tapes 36 and 38 could be connected to ground pads. Alternately, selected fingers of each tape could be coupled to either signal, voltage or ground pads. Indeed the fingers of the three layers could be so coupled as to surround each signal carrying finger with ground coupled fingers as to effectively create a co-axial line thus further improving the signal transmission qualities of the assembly.

Figure 7:
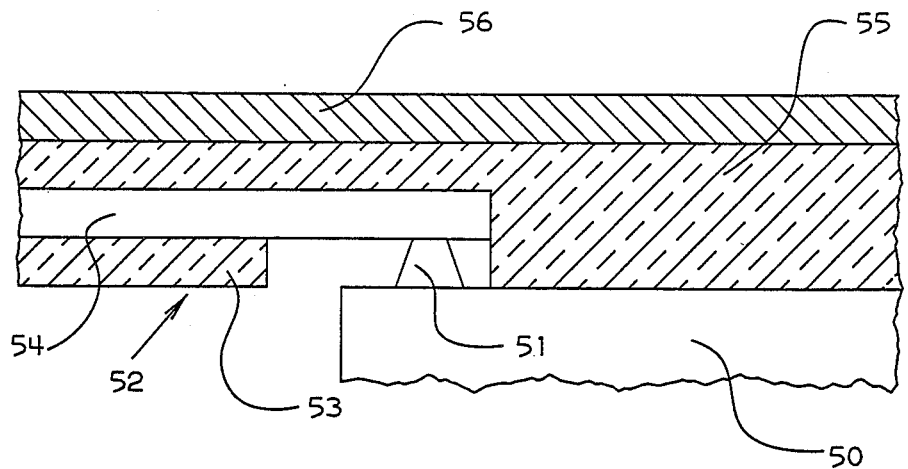
FIG. 7, shows a partial sectional view of a chip having a single layer tape provided with a continuous cover sheet.
Figure 8:
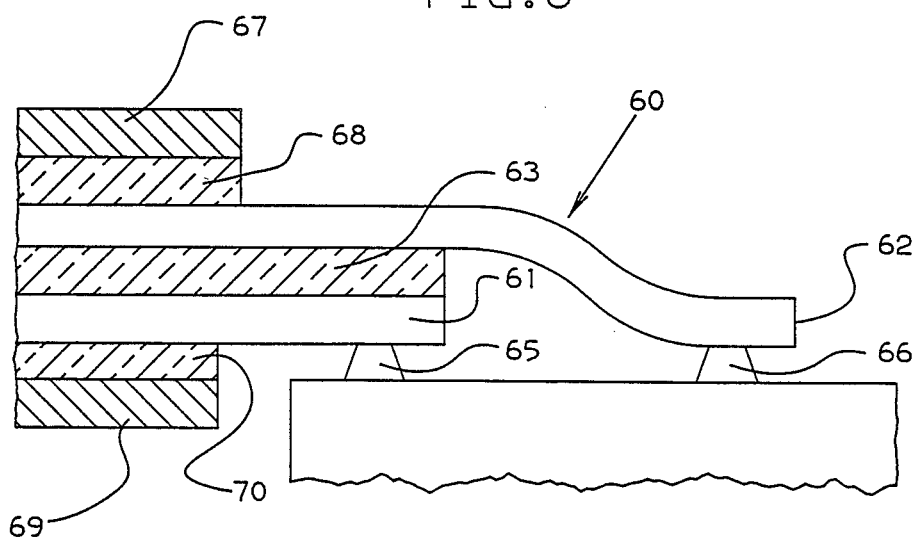
FIG. 8, shows a partial sectional view of a chip having a dual level tape and top and bottom cover sheets.

Also other configurations could be used, two of which are shown in FIGS. 7 and 8.

FIG. 7 shows a semiconductor chip 50 provided with a series of signal pads 51 to which is attached a single layer tape 52 comprised of an insulating layer 53 and a plurality of metal fingers 54. After tape 52 has its finger tips bonded to the pads 51, as discussed above, a metallic, planar conductive cover sheet or foil 56 is secured to the tape 52 and to the active face of the chip 50, i.e. the face of chip carrying the pads 51. Such cover sheets in addition to being planar, i.e. continuous, are also usually uniform in thickness but need not be so.

This continuous cover sheet 56 can, when serving as a ground plane, improve the signal transmission characteristics of the chip.

FIG. 8 shows a multilayer tape 60 comprised of two sets of metallic fingers 61 and 62 separated by an insulating layer 63. The fingers 61 and 62 are first respectively bonded to chip pads 65 and 66. Then on top of fingers 62 there is disposed a first metallic, planar, cover sheet 67 insulated from and affixed to the fingers 62 by a suitable insulator 68 such as described above. Also disposed below the fingers 61 is a second metallic plane or cover sheet 69 which is insulated from and secured to the fingers 61 by a suitable insulator 70 such as described above.

Both the sheet 56 shown in FIG. 7 and the sheets 67 and 69 shown in FIG. 8 can be secured to the respective underlying tapes by any suitable method such as by adhesives or by thermo-bonding as described above, after the respective underlying tapes are secured to the pads on the chips.

Also, it should be understood that both of these sheets 67 and 69 can be either uniform or non-uniform in thickness and both can extend over the surface of the body of the chip.

The sheets 67 and 69 can both be coupled to ground as to provide better transmission characteristics of the device when the finger sets 61 and 62 are acting as signal leads.

By providing these metallic sheets numerous advantages such as diminished electromigration between leads, improved protection against corrosion, improved mechanical strength, positive electrical insulation, improved thermal performance and reduced tape curl as well as providing a flat marking surface.

These metallic cover sheets also provide the chip with better electrical performance by lowering signal lead crosstalk, improving signal lead impedance, providing greater signal lead noise suppression as well as increasing the electromagnetic and radio frequency shielding characteristics of the device.

Still further any of the individual features of the present invention illustrated in FIG. 2 through FIG. 8 could be added to individual features shown in any other figure as would now be obvious to one skilled in the art.

While the invention has been particularly shown and described with reference to preferred embodiments thereof, it will be understood by those skilled in the art that various changes in form and detail may be made therein without departing from the spirit and scope of the invention.

What is claimed is:

1. A semiconductor chip assembly comprising:
   a semiconductor chip having a plurality of rows of bonding pads on a face thereof, the bonding pads in each row lying on the same longitudinal axis as a respective pad in an adjacent row,
   a first lead carrying tape comprising an insulating layer having a plurality of conductive leads thereon, said leads having inner and outer end portions, the inner end portions of the conductive leads extending beyond said insulating layer, each inner end portion of each lead, extending beyond the layer on said first tape, lying on a respective longitudinal axis,
   inner end portions of selected ones of said leads on said first tape secured directly to respective bonding pads in a first selected row of said bonding pads,
   a second tape comprising an insulating layer having a conductive layer thereon overlying said first lead carrying tape, said conductive layer on said second tape including a plurality of conductive leads, having inner and outer end portions, said inner end portions extending beyond the insulator of said second tape and lying on a respective longitudinal axis, and
   inner end portions of selected ones of said leads of said second tape secured directly to respective pads in a second selected row of said pads, each respective inner end portion of said selected leads of said second tape aligned to and overlying the longitudinal axis of a respective inner end portion of a selected lead on the insulating layer of said first tape and overlying the respective inner end portion of said first tape.

2. The chip assembly of claim 1 wherein said second tape is secured to said first tape.

3. The chip assembly of claim 1 wherein said second tape is secured to said first tape with an adhesive.

4. The chip assembly of claim 1 wherein said second tape is secured to said first tape with a heat flowable polymeric.

5. The chip assembly of claim 1 wherein an insulator is disposed over said second tape.

6. The chip assembly of claim 1 wherein a polymer is disposed over the conductive leads of second tape.

7. The chip assembly of claim 1 wherein there is further provided a continuous cover sheet extending over the leads secured to said pads.

8. The chip assembly of claim 7 wherein said cover sheet has a uniform thickness.

9. A semiconductor chip assembly having a plurality of conductive leads secured to respective bonding pads on a face of a chip and a first conductive cover sheet insulatively bonded to said leads and extending over the face of the chip and the above leads secured thereto.

10. A semiconductor chip assembly having tapes comprising a plurality of leads secured directly to respective bonding pads on a face of a semiconductor chip and top and bottom conductive sheets respectively and insulatively secured above and below the leads secured to said bonding pads.

11. The semiconductor chip assembly of claim 7 wherein there is provided a conductive sheet disposed beneath the the first tape.

12. The semiconductor chip assembly of claim 1 wherein there is further provided additional tapes having conductive layers thereon and wherein said conductive layers on said additional tapes include a plurality of conductive leads, the end portions of said conductive leads extending beyond said tapes, and
   selected end portions of said leads of said additional tapes are secured directly to respective pads in selected rows of said plurality of rows.

* * * * *